United States Patent
Matuszewski et al.

(10) Patent No.: US 7,200,205 B1
(45) Date of Patent: Apr. 3, 2007

(54) INTERFACE DEVICE FOR TESTING A TELECOMMUNICATION CIRCUIT

(75) Inventors: John Matuszewski, Centennial, CO (US); Jeffrey Blatnik, Centennial, CO (US); Richard Wolf, Marlton, NJ (US)

(73) Assignee: ADC Incorporated, Centennial, CO (US)

( * ) Notice: Subject to any disclaimer, the term of this patent is extended or adjusted under 35 U.S.C. 154(b) by 0 days.

(21) Appl. No.: 10/603,463

(22) Filed: Jun. 25, 2003

(51) Int. Cl.
| | |
|---|---|
| *H04M 1/24* | (2006.01) |
| *H04M 3/08* | (2006.01) |
| *H04M 3/22* | (2006.01) |
| *H04M 1/00* | (2006.01) |
| *H04M 9/00* | (2006.01) |

(52) U.S. Cl. .................. 379/26.01; 379/27.06; 379/27.07; 379/399.01; 379/413.02; 379/413.04

(58) Field of Classification Search ............ 379/15.01, 379/19, 21, 26.01, 27.07, 29.01, 399.01, 379/413.02, 413.03, 413.04, 166; 324/754, 324/755; 439/217, 219, 248
See application file for complete search history.

(56) References Cited

U.S. PATENT DOCUMENTS

| | | | | |
|---|---|---|---|---|
| 4,581,494 | A | * | 4/1986 | Pickens ...................... 379/22 |
| 4,756,017 | A | * | 7/1988 | Bush .......................... 379/23 |
| 4,841,559 | A | * | 6/1989 | Curtis ..................... 379/27.01 |
| 5,170,429 | A | | 12/1992 | Stocklin et al. |
| 5,297,199 | A | * | 3/1994 | Graham et al. ........ 379/413.04 |
| 5,402,465 | A | * | 3/1995 | Foltz ..................... 379/27.06 |
| 5,553,136 | A | * | 9/1996 | Meyerhoefer et al. . 379/413.04 |
| 5,671,273 | A | * | 9/1997 | Lanquist ................ 379/413.04 |
| 6,039,578 | A | * | 3/2000 | Suffi et al. ..................... 439/54 |
| 6,215,856 | B1 | * | 4/2001 | Aponte et al. ........... 379/29.01 |
| 6,252,941 | B1 | * | 6/2001 | Daoud ......................... 379/19 |
| 6,418,195 | B1 | * | 7/2002 | Autry et al. .................. 379/21 |

FOREIGN PATENT DOCUMENTS

| | | |
|---|---|---|
| DE | 200 01 060 U1 | 1/2000 |
| DE | 200 01 060 U1 | 4/2000 |
| WO | WO 02/25956 A | 3/2002 |

OTHER PUBLICATIONS

Corning Cable Systems LLC, FlexBet™ (Flexible Building Entrance Terminal) Modular Components, p. 3, Aug. 2002, Product Specifications. 6 pages.
Corninig Cable Systems LLC, FlexBet™ (Flexible Building Entrance Terminal) Modular Components, p. 3, Aug. 2002, Product Specifications, 6 pages.
Corning Cable Systems LLC, Test Probe Model admitted by Applicants as prior art of Jun. 25, 2003. 1 page.
Photograph of Krone Test Probe Module, admitted by Applicants as prior art af of Jun. 25, 2003, 1 page.

* cited by examiner

*Primary Examiner*—Quoc Tran
(74) *Attorney, Agent, or Firm*—Merchant & Gould P.C.

(57) ABSTRACT

An interface device and method for testing a telecommunication circuit by utilizing a test cord that has a first end that is integrated with the interface device and a second end that terminates with a test connector. Upon insertion of the test connector into a test port of a connectivity block, the interface device may be configured to allow for monitoring of the telecommunication circuit, without disrupting the circuit. Similarly, the interface device may be configured to disrupt the telecommunication circuit and allow a user to examine both sides of the circuit.

33 Claims, 4 Drawing Sheets

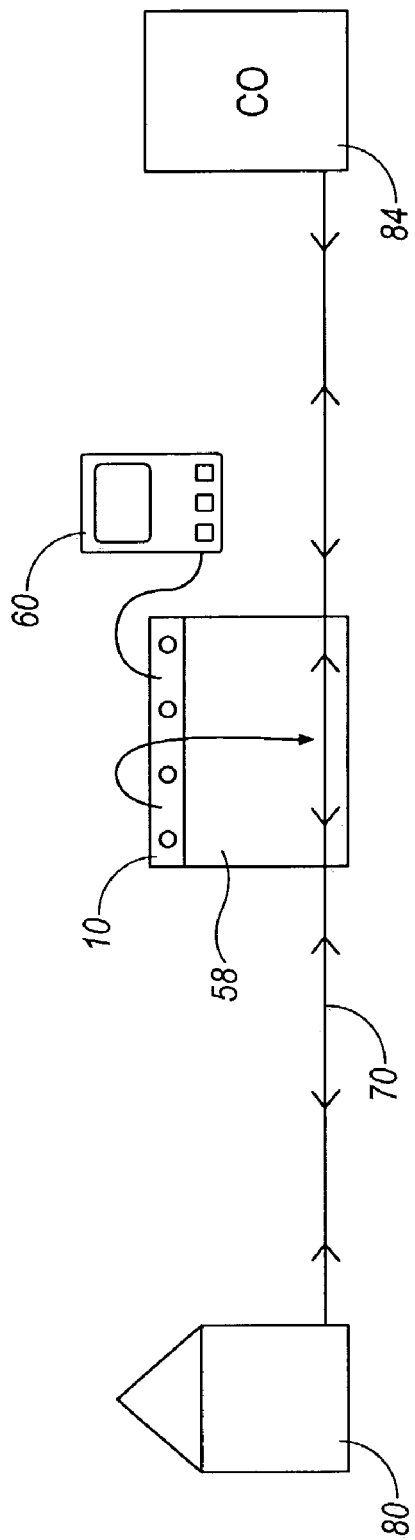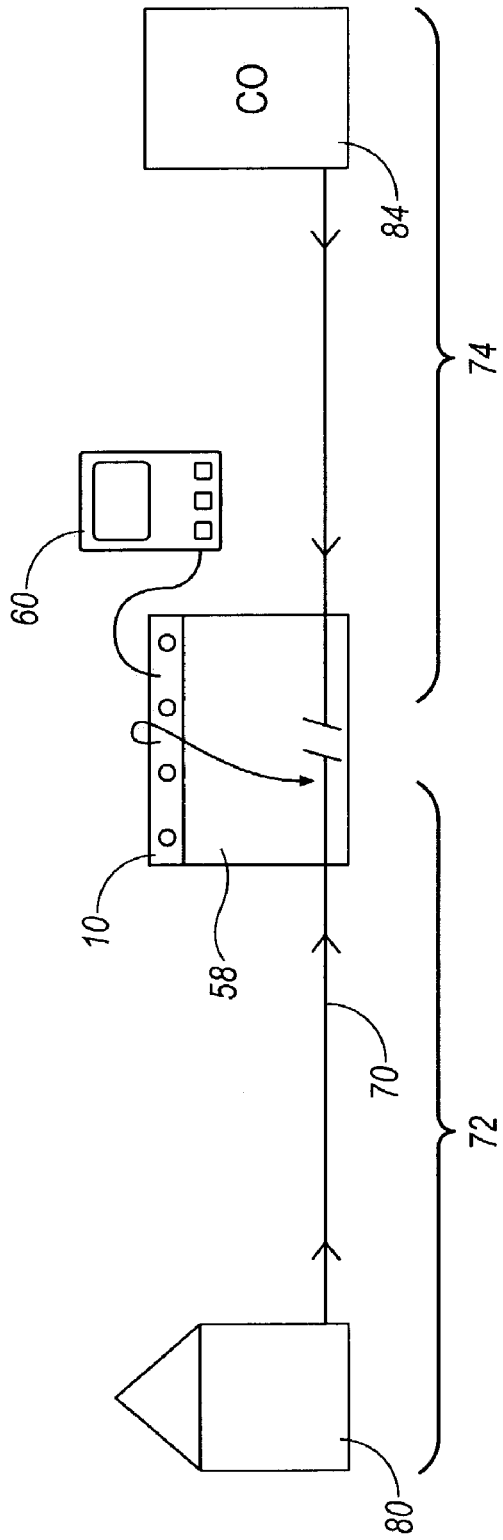

INTERFACE DEVICE FOR TESTING A TELECOMMUNICATION CIRCUIT

FIELD OF THE INVENTION

The present invention relates generally to the field of telecommunication networks, and, more specifically, to a new device and method for interfacing a telecommunication circuit for testing purposes.

BACKGROUND OF THE INVENTION

In order to provide services such as voice and data communication to a customer, the phone company is often required to connect, or interface, their telecommunications network with the telecommunications network of the customer's business or residence. This is because the phone company's network, although usually quite vast, does not typically extend into buildings such as private residences or commercial offices. Accordingly, the telephone company's services are provided to a customer by interfacing the telephone company's network with the internal communication network of the customer's building, which then distributes the services throughout the building. The point at which these two networks connect with one another is at the building entrance terminal (BET). The BET typically includes, among other things, one or more connectivity blocks that allow for the easy establishment of connections between a first group of wires (representing the phone company's network) and a second group of wires (representing the internal communication network of the building).

A recent development in certain connectivity blocks, such as those developed by Krone, Inc., is the inclusion of test ports. Through the insertion of a test cord and plug into a test port, a telephone company technician is provided with two simple ways of testing the telecommunication circuit made up of the telephone company's network and internal communication network of the building. Specifically, by insertion of the test plug into the test port, the technician can monitor the circuit without disrupting it, or alternatively, disconnect the two networks from one another and examine each network independently from the other. This latter testing method is often referred to as "looking both ways".

Although the addition of test ports provides a technician with significant advantages in testing a circuit, it also creates several new problems. First, because the proprietary nature of the test port, one or more specific types of cords with the appropriate test plugs must be available to the technician to allow him or her to test the circuit. As a result, the telephone company has to purchase and supply the appropriate test cord or cords to each of their technicians. Subsequently, each technician is required to carry the additional cord(s), resulting in more equipment to transport from site to site, along with an increased chance of forgetting or losing the specialized and expensive test cord(s). Furthermore, the addition of one or more new cords can lead to greater confusion for the technician, who already has a significant number of tools he or she must be familiar with and know when to use.

SUMMARY OF THE INVENTION

The present invention relates to an interface device for testing a telecommunications circuit. Included within the device is a test cord with a first end integrated with the interface device, and a second end terminating with a test connector, such as, for example, a probe or plug. Also included are a first interface and a second interface for selectively attaching a diagnostic tool. Through use of one or more switches, the interface device can be configured to allow for monitoring of a selected telecommunication circuit without disrupting the circuit, or alternatively, allow for testing of the circuit by disrupting it and allowing a user to examine both sides of the circuit.

BRIEF DESCRIPTION OF THE DRAWINGS

FIG. 3A illustrates the monitoring of a telecommunication circuit by the interface device without disruption of the circuit.

FIG. 3B illustrates the monitoring of a telecommunication circuit by the interface device where the circuit is disrupted and analyzed on opposite sides of the disruption.

DESCRIPTION OF THE PREFERRED EMBODIMENT

Figure 1:
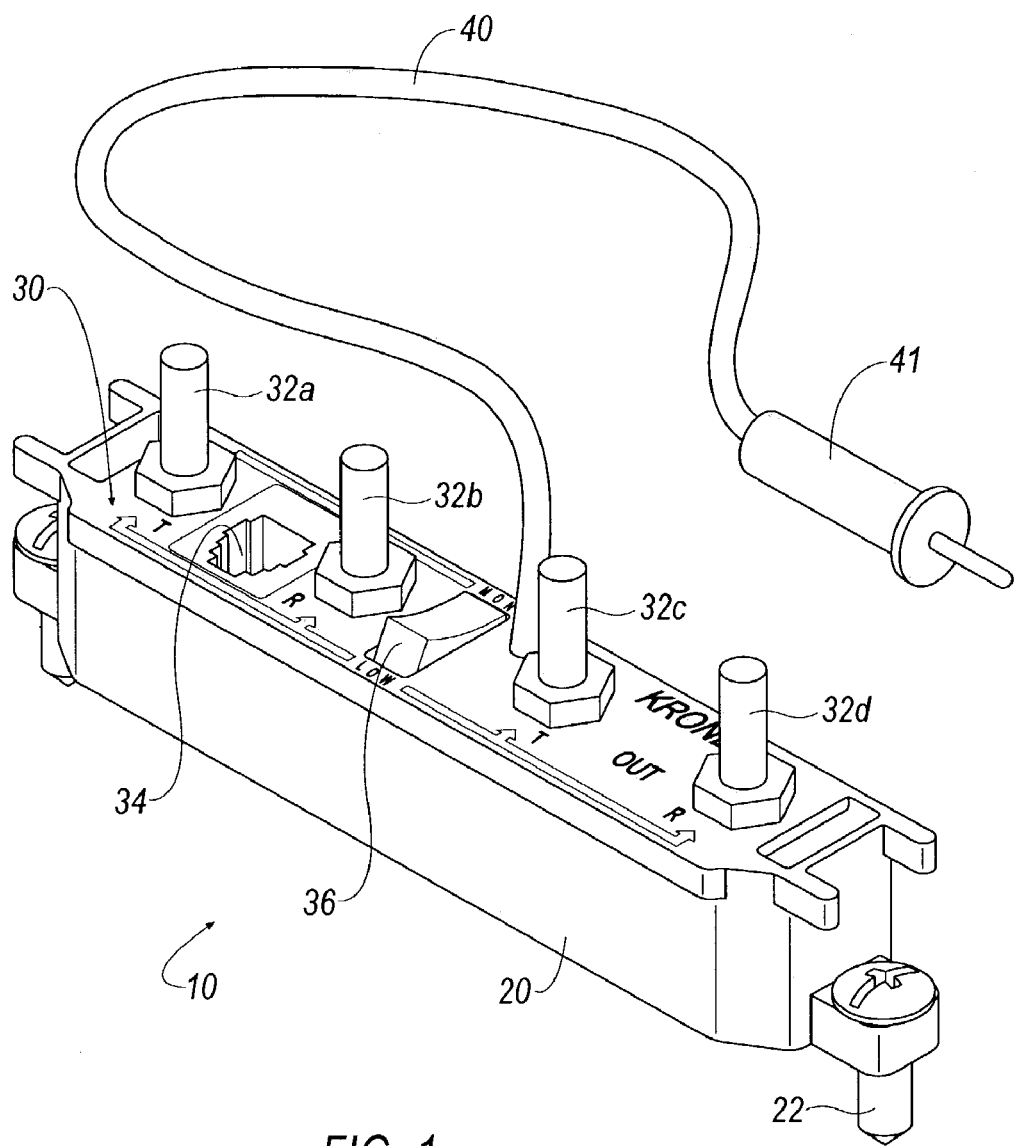
FIG. 1 illustrates an interface device for testing a telecommunication circuit according to one embodiment of the present invention.

One preferred embodiment of the present invention will now be discussed in reference to FIG. 1. Illustrated in FIG. 1 is an interface device 10 for testing a telecommunication circuit. Interface device 10 includes a body 20 with a top surface 30.

Projecting out from the top surface 30 of device 10 are a plurality of conductors 32a–32d that may be used to connect various pieces of testing equipment or diagnostic tools to interface device 10. According to the illustrated embodiment, conductors 32a–32d are comprised of studs or posts. Alternatively, conductors 32a–32d may be of any design that readily allows for the establishment of an electrical connection, such as, for example, threaded inserts, captive fasteners, test leads or test ports.

An electrical connection with one or more of the conductors 32a–32d may be established by several means. Several examples of the types of electrical connections that can be made, provided merely for illustrative purposes, include the placing of a bare wire in contact with a conductor 32 by wrapping the wire around the conductor 32, or the use of clips or plugs, such as, alligator clips or banana plugs.

Also present on the top surface 30 of interface device 10 is a jack 34 for accepting a plug from a diagnostic tool or piece of testing equipment. Accordingly, a diagnostic tool can be placed in electrical communication with the interface device 10 through the use of conductors 32a–32d, or, alternatively, jack 34. In the present embodiment, jack 34 complies with the RJ-11 standard used for data transmission. However, jack 34 is not limited to any one type of format, but may be designed to comply with any format commonly encountered by telephone company technicians.

Integrated with the interface device 10 is a test cord 40 which projects out from the top surface 30 of interface device 10. The free end of test cord 40 is terminated with a test connector 41, 42, 44 designed to interface with the test port 54 found within certain connect blocks such as, for example, Krone® Series II connect blocks. The connector 41, 42, 44 is not limited to any specific design or type, but instead can be of any configuration. For example, according to the embodiment illustrated in FIG. 1, the connector comprises a test probe 41, while according to the embodiments illustrated in FIGS. 2 and 4, respectively, the connector is a single plug 42 or multi-pair plug 44. For purposes of clarity during the remainder of the discussion, reference will simply be made to the specific type of connector illustrated in the Figures. However, it should be understood that these specific types of connectors are provided not as limitations but merely as examples.

According to the embodiment illustrated in FIG. 1, provided on the top surface 30 of interface device 10 is a two-position switch 36 for selectively configuring the interface device 10 into either a first or second operating state, as will be discussed in detail below. In the illustrated embodiments, switch 36 is a rocker-type switch. However, according to alternative embodiments, switch 36 may be any type of switch, such as, for example, a button-type switch, rotary-type switch or toggle-type switch, that can be placed into either a first or second state.

The body 20 of interface device 10 incorporates an attachment mechanism for securing the interface device 10 to a surface. In the embodiment depicted in FIGS. 1–3, the attachment mechanism comprises screws 22 for securing the interface device 10. Alternatively, the interface device 10 can be secured to a surface by numerous other attachment mechanisms, including, but not limited to, clips, magnets and adhesives. The interface device 10 can also be mounted onto a mounting frame 51, such as, for example, a Krone® Back Mount Frame. The frame 51 allows for various telecommunications equipment, such as connectivity blocks 52, to be easily secured to a wall or other surface. In this manner, an interface device 10 can be secured nearby or next to a connectivity block 52 by simply mounting the interface device 10 upon the frame 51.

Figure 2:
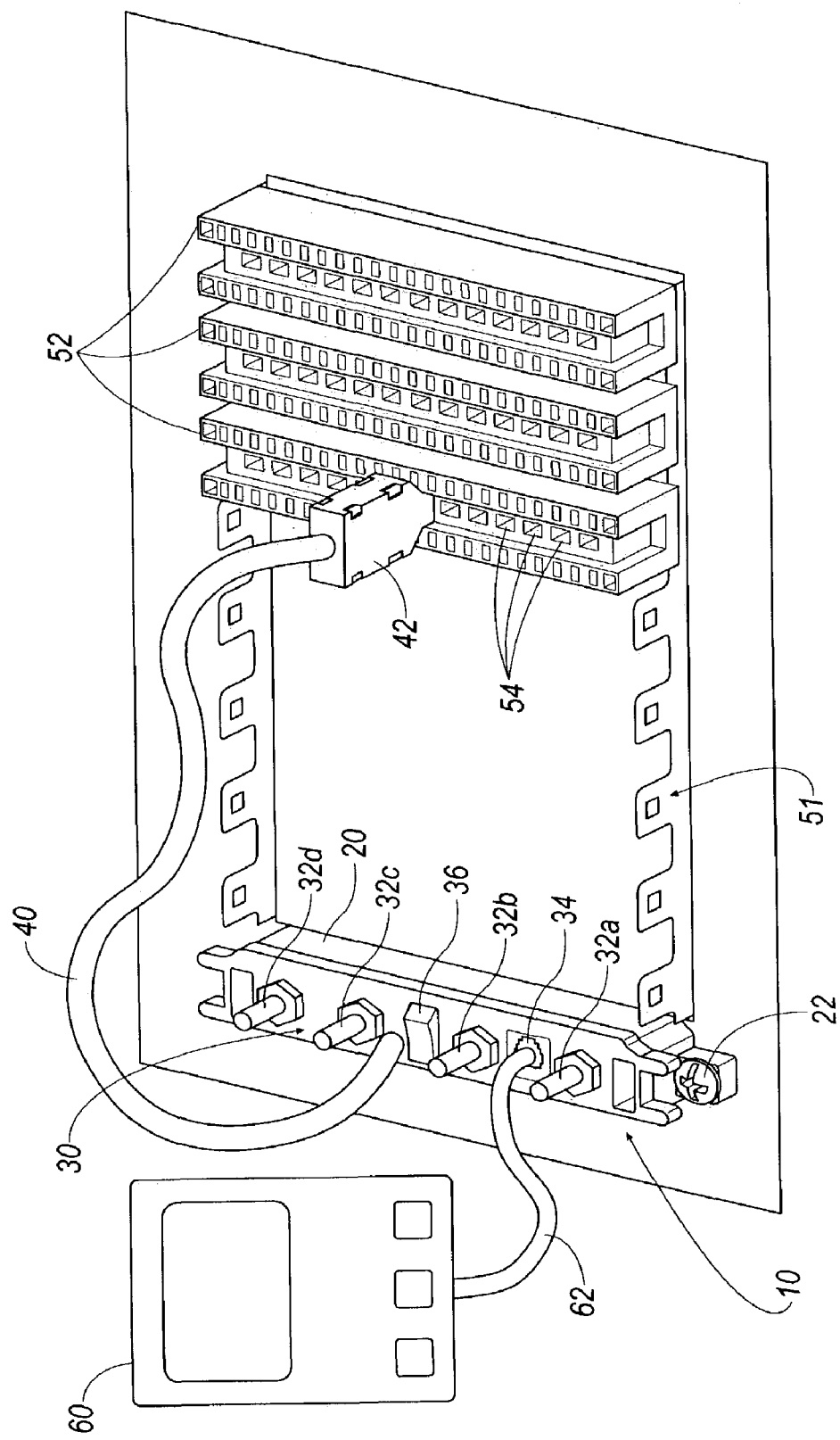
FIG. 2 illustrates how the interface device for testing a telecommunication circuit may be used in conjunction with one or more connect blocks according to one embodiment of the present invention.

Operation of the interface device 10, in accordance with a first embodiment illustrated in FIG. 2, will now be described. Secured upon a mounting frame 51 are several connectivity blocks 52. Mounted next to frame 51 is the interface device 10. According to the example depicted in FIG. 2, interface device 10 is mounted by means of screw 22. However, as indicated above, other alternative attachment mechanisms could be utilized to mount interface device 10 onto a surface, or alternatively, onto frame 51.

In order to test a specific circuit, the technician simply locates the integrated test cord 40 of the interface device 10 and insert the test plug 42, located at the free end of test cord 40, into the appropriate test port 54 of connectivity block 52 that corresponds to the circuit that the technician desires to test. The technician can then either monitor the circuit without disrupting it, or disrupt the circuit and test it by "looking both ways". Selection of one of these two possible testing methods is accomplished by means of switch 36.

When switch 36 is placed in a first position, the interface device 10 is configured to monitor the circuit without disrupting it. The technician can then monitor the circuit by attaching a diagnostic tool 60 to the interface device 10.

FIG. 3A illustrates the use of interface device 10 to monitor a circuit without disrupting the circuit. Specifically, a communications circuit 70 runs between a customers's building 80 and the central office 84 of a local telephone company. In-between these two endpoints, the circuit 70 passes through the building entrance terminal (BET) 58 associated with the customer's building 80. By connecting a diagnostic tool 60 to interface device 10, and placing switch 36 of interface device 10 into a first position, the technician is able to monitor the signals running along the communication circuit 70, back and forth between the customer's building 80 and the central office 84, without causing any disruption in circuit 70.

Alternatively, when switch 36 is placed into a second position, the interface device 10 disrupts the circuit path, isolating the telephone company's network from the building's telecommunication network. By attaching the appropriate diagnostic tool 60 to the interface device 10, the technician is able to "look both ways" or evaluate each side of the circuit independent from the other side of the circuit.

FIG. 3B illustrates the use of interface device 10 to disrupt and test a circuit. In this example, switch 36 of interface device 10 is placed into a second position. This configures the interface device 10 so that upon the device 10 being connected to the communications circuit 70, circuit 70 is physically disrupted into two distinct circuit portions. The first circuit portion 72 of circuit 70 runs between the customer's building 80 and the BET 58, while the second circuit portion 74 runs between the BET 58 and the CO 84 of the telephone company. A technician can then connect a diagnostic tool 60 to interface device 10 and evaluate either the first circuit portion 72 and/or second circuit portion 74 independently from one another.

Figure 4:
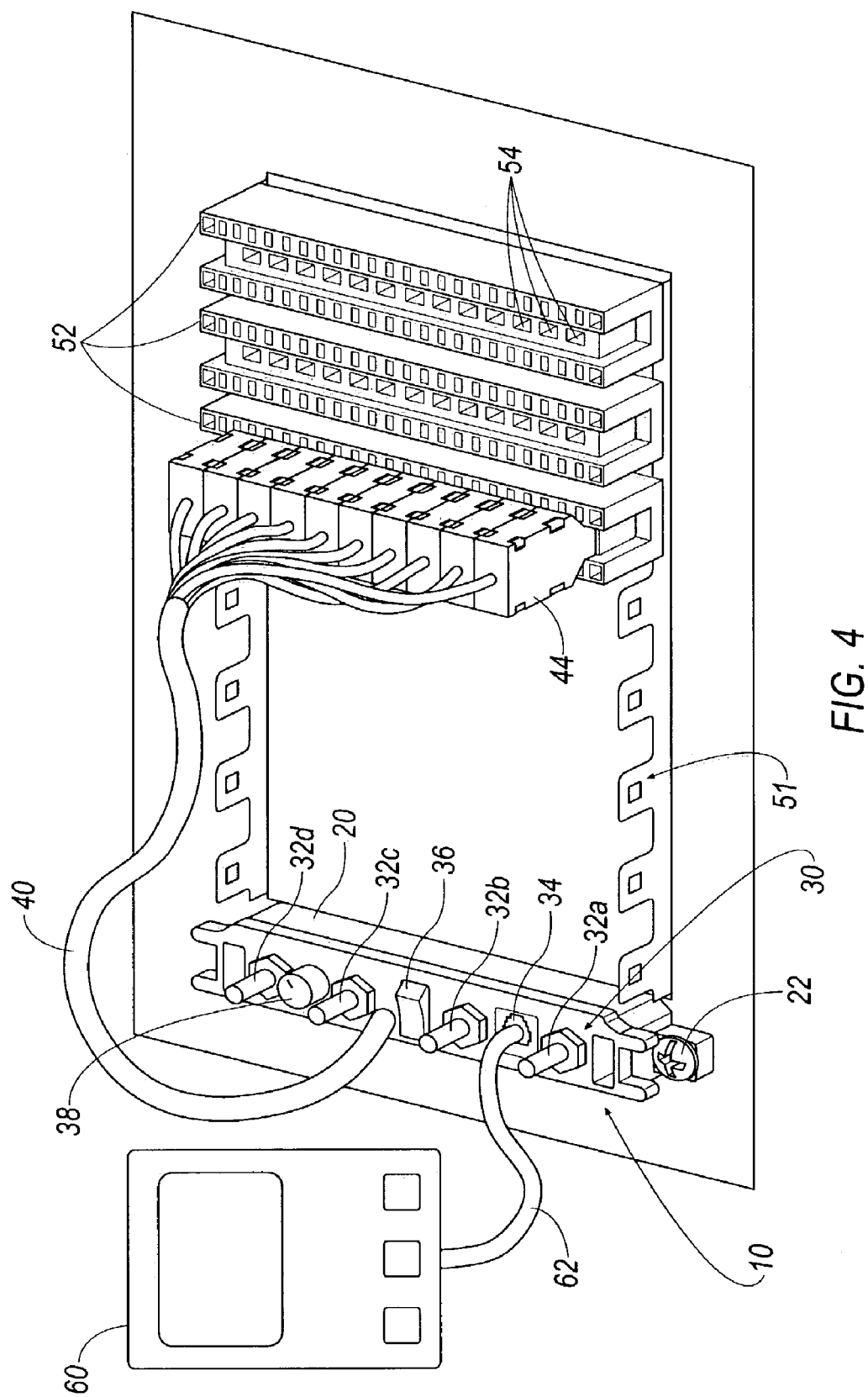
FIG. 4 illustrates how the interface device for testing a telecommunication circuit may be used in conjunction with one or more connect blocks according to another embodiment of the present invention.

According to an alternative embodiment, illustrated in FIG. 4, the interface device 10 utilizes a multi-pair plug 44 as its test connector. The multi-pair plug 44 inserts into a plurality of test ports 54 provided upon a connectivity block 52. In this manner, the interface device 10 does not connect to one individual circuit at a time; but to a plurality of communication circuits. The technician selects which circuit to monitor or conduct tests upon through means of a second switch 38. Thus, for example, placing switch 38 into one of ten possible states allows for the selection of ten possible communication circuits.

According to the embodiment illustrated in FIG. 4, switch 38 is a rotary-type of switch. However, any type of multi-positional switch can be utilized provided that the switch offers a sufficient number of states to correspond to each communication circuit connected to by multi-pair plug 44.

In a similar embodiment (not depicted), test cord 40 is terminated with a multi-pair plug 44 while interface device 10 utilizes a single switch to both control and configure the device. Specifically, the single switch would provide dual functions, including the selection of one of the communication circuits, along with configuring the device to either monitor the selected circuit without disrupting it, or alternatively, disrupt the selected circuit, thereby allowing the circuit to be tested. One such example, provided merely for illustrative purposes, would utilize a rotary switch that could be placed into twice as many states as there are circuits connected to the interface device 10. The number of states offered by the switch would be grouped into pairs, with each pair of states corresponding to one communication circuit. Within each pair of states, one state would configure the interface device 10 to monitor the selected circuit without disrupting it, while the other state would disrupt the selected circuit.

According to another embodiment of the invention (not depicted), the interface device 10 would be connected to a plurality of communication circuits by means of a multi-pair plug 44, while selection of a circuit and configuration of the interface device 10 would be carried out electronically. In this manner, the functions previously controlled by manipulation of one or more mechanical switches can now be controlled directly by the diagnostic tool 60 connected to the interface device 10.

Depending on the type of connectivity the diagnostic tool 60 offers, it can be communicably linked to interface device 10 by one of two methods. The first method of connecting diagnostic tool 60 to interface device 10 is through use of conductors 32a–32d. Utilizing this connection method, a variety of tools, ranging from, for example, a simple handset to a sophisticated digital multimeter, can be connected to the interface device 10. Alternatively, a diagnostic tool 60 can connect to the interface device 10 by means of jack 34. If configured to be a RJ-11 standardized jack, jack 34 would allow for a standard telephone to be connected to the interface device 10. This would provide the further advantage of allowing not only a technician, but also the customer or end user of the circuit to be able to perform some basic testing of the circuit.

The interface device 10, as described in the embodiments discussed above, provides for several advantages in testing a telecommunication circuit. Unlike known devices and methods for interfacing and testing a telecommunication circuit, Applicant's interface device 10 provides a technician with the ability to either monitor the circuit without disrupting it, or alternatively, disrupt the circuit and evaluate it through "looking both ways", all the while requiring the use of only a single test cord 40 integrated with the interface device 10. Furthermore, by attaching the interface device 10 next to or nearby the connectivity blocks 52, the technicians no longer have to carry their own test cords, resulting in significant savings for the telephone company as test cords no longer need to be purchased for each technician. Attachment of the interface device 10 nearby the connectivity blocks 52 also assures that a technician will always have access to a test cord and test plug. Lastly, by requiring the use of only a single test cord, the present invention is seen to be much simpler to use compared to prior testing systems that mount within a cabinet or BET as those systems typically require the use of two separate cords, including a first cord for monitoring the circuit and a second cord for disrupting the circuit and "looking both ways".

While the invention has been specifically described in connection with certain specific embodiments thereof, it is to be understood that this is by way of illustration and not of limitation, and the scope of the appended claims should be construed as broadly as the prior art will permit.

What is claimed is:

1. An interface device for testing a telecommunication circuit, comprising:
   a test cord with a first end integrated with said interface device and a second end terminating with a test connector for connecting to the telecommunication circuit at a point;
   at least two interfaces for selective attachment of a diagnostic tool, a first interface comprising a plurality of conductors, and a second interface comprising a jack; and
   a first switch configured to be selectively placed into at least one of a first position and a second position, the first switch position enabling monitoring operation of the circuit without disruption and the second switch position disrupting operation of the circuit and permitting analysis of the circuit on opposite sides of the point.

2. The interface device according to claim 1, wherein said test connector comprises a test probe for connecting to the telecommunication circuit.

3. The interface device according to claim 1, wherein said test connector comprises a test plug for connecting to the telecommunication circuit.

4. The interface device according to claim 1, wherein said test connector comprises a multi-pair plug for connecting to a plurality of telecommunication circuits, and said interface device further comprises a second switch configured to be selectively placed into one of a plurality of positions, each of said positions corresponding to one telecommunication circuit of said plurality of telecommunication circuits.

5. The interface device according to claim 4, wherein said second switch comprises a rotary switch.

6. The interface device according to claim 1, wherein each of said plurality of conductors comprises one of a stud, banana plug, test port and test lead.

7. The interface device according to claim 6, wherein said plurality of conductors comprises four studs, with two of said studs permitting analysis of a first side of the point and the other two of said studs permitting analysis of a second side of the point.

8. The interface device according to claim 1, wherein said jack is a RJ-11 type jack.

9. The interface device according to claim 1, wherein said first switch is one of a rocker-type switch, a toggle-type switch, rotary-type switch, and a button-type switch.

10. The interface device according to claim 1, further comprising an attachment mechanism for mounting said interface device onto a surface.

11. The interface device according to claim 10, wherein the telecommunication circuit point is associated with a connectivity block having a test port, said interface device being mounted nearby the connectivity block so that said test connector of said second end of said test cord is configured to be selectively connected to the test port.

12. The interface device according to claim 10, wherein said attachment mechanism comprises one of screws, clips, magnets, and adhesive.

13. The interface device according to claim 10, wherein said attachment mechanism comprises a frame secured to the surface and configured to receive at least one piece of telecommunication equipment.

14. A telecommunication system with testing capabilities, comprising:
   a first telecommunication network for supplying voice and data services to a selected access point from a centralized location;
   a second telecommunication network selectively connected to the first telecommunication network at said selected access point and used to distribute said services to end users;
   one or more connectivity blocks associated with said selected access point that interface said first telecommunication network with said second telecommunication network, each of said one or more connectivity blocks including one or more test ports; and
   an interface device for testing a telecommunication circuit, comprising:
      a test cord with a first end integrated with said interface device and a second end terminating with a test connector;
      a first interface comprising a plurality of conductors that allow for a selective attachment of a first diagnostic tool;
      a second interface comprising a jack that allows for a selective attachment of a second diagnostic tool; and
      a first switch configured to be selectively placed into at least one of a first and a second position;

wherein inserting said test connector into one of said test ports enables a user to configure said interface device to allow for monitoring of said telecommunication circuit without disrupting said circuit by placing said first switch in said first position, and enables the user to configure said interface device to disrupt said telecommunication circuit and allow said user to examine both sides of said circuit by placing said first switch in said second position.

15. The telecommunication system according to claim 14, wherein said disruption of said telecommunication circuit includes the disconnection of said first telecommunication network from said second telecommunication network.

16. The telecommunication system according to claim 14, wherein said test connector comprises one of a test probe and a test plug.

17. The telecommunication system according to claim 16, wherein said test plug is a multi-pair plug for connecting to a plurality of said test ports, and said telecommunication system further comprises a second switch configured to be placed into one of a plurality of positions, each of said positions corresponding to one telecommunication circuit out of a plurality of telecommunication circuits.

18. The telecommunication system according to claim 14, wherein each of said plurality of conductors comprises one of a stud, banana plug, test port and test lead.

19. The telecommunication system according to claim 14, wherein said jack is a RJ-11 type jack.

20. The telecommunication system according to claim 14, wherein said first switch is one of a rocker-type switch, a toggle-type switch, a rotary-type switch, and a button-type switch.

21. The telecommunication system according to claim 14, further comprising an attachment mechanism for mounting said interface device onto a surface.

22. The telecommunication system according to claim 21, wherein said attachment mechanism comprises one of screws, clips, magnets, and adhesives.

23. The telecommunication system according to claim 21, wherein said attachment mechanism comprises a frame secured to the surface and configured to receive said one or more connectivity blocks.

24. The telecommunication system according to claim 14, wherein said interface device is mounted nearby said one or more connectivity blocks so that said test connector of said second end of said test cord is configured to be selectively connected to said one or more test ports.

25. A method of testing a telecommunication circuit, comprising the steps of:
 inserting a test connector into a test port of a connectivity block, said test connector located at a free end of a test cord that is integrated with an interface device;
 connecting a diagnosis tool to one of a first interface and a second interface on said interface device;
 monitoring an operation of the telecommunication circuit without disrupting it by placing a switch on said interface device in a first state; and
 disrupting the telecommunication circuit by placing said switch on said interface device in a second state, permitting analysis of the telecommunication circuit on opposite sides of the connectivity block.

26. The method according to claim 25, further comprising the step of mounting said interface device onto a surface nearby the connectivity block.

27. An interface device for testing a plurality of telecommunication circuits, comprising:
 a test cord having a first end integrated with the interface device and a second end terminating with a multi-pair plug capable of connecting to the plurality of telecommunication circuits;
 at least two interfaces for selective attachment of a diagnostic tool, a first interface comprising a plurality of conductors, and a second interface comprising a jack; and
 a switch configured to be selectively placed into one of a plurality of positions, each of the plurality positions corresponding with one of the plurality of telecommunication circuits;
 wherein placing the switch into any of the plurality of positions selects the corresponding telecommunication circuit for either testing, whereby a selected telecommunication circuit is disrupted, or monitoring, whereby the selected telecommunication circuit is not disrupted.

28. The interface device according to claim 27, wherein the switch comprises a rotary switch.

29. The interface device according to claim 27, wherein each of the plurality of conductors comprises one of a stud, banana plug, test port and test lead.

30. The interface device according to claim 27, further comprising an attachment mechanism for mounting said interface device onto a surface.

31. An interface device for testing a plurality of telecommunication circuits, comprising:
 a test cord having a first end integrated with the interface device and a second end terminating with a multi-pair plug capable of connecting to the plurality of telecommunication circuits; and
 at least two interfaces for selective attachment of a diagnostic tool, a first interface comprising a plurality of conductors, and a second interface comprising a jack;
 a diagnostic tool selectively attached to one of the at least two interfaces, the diagnostic tool being configured to control selection of any one of the plurality of telecommunication circuits, the diagnostic tool also being configured to control selection of either testing, whereby a selected telecommunication circuit is disrupted, or monitoring, whereby the selected telecommunication circuit is not disrupted, of a selected telecommunication circuit.

32. The interface device according to claim 31, wherein each of the plurality of conductors comprises one of a stud, banana plug, test port and test lead.

33. The interface device according to claim 31, further comprising an attachment mechanism for mounting the interface device onto a surface.

\* \* \* \* \*